United States Patent [19]
Philipp

[11] Patent Number: 5,730,165
[45] Date of Patent: Mar. 24, 1998

[54] TIME DOMAIN CAPACITIVE FIELD DETECTOR

[76] Inventor: Harald Philipp, 4812 Scott Rd., Lutz, Fla. 33549

[21] Appl. No.: 578,464

[22] Filed: Dec. 26, 1995

[51] Int. Cl.[6] .............................. F16K 31/02; E03C 1/05; G01R 27/26
[52] U.S. Cl. .............................. 137/1; 251/129.04; 4/623; 239/24; 324/677; 324/678
[58] Field of Search .............................. 251/129.04; 4/623; 239/24; 222/52; 324/677, 678; 137/1

[56] References Cited

U.S. PATENT DOCUMENTS

| | | | |
|---|---|---|---|
| 3,333,160 | 7/1967 | Gorski | 4/623 X |
| 3,453,535 | 7/1969 | Anglin | 324/677 |
| 3,551,919 | 1/1971 | Forbes | 251/129.04 X |
| 3,575,640 | 4/1971 | Ishikawa | 4/623 X |
| 3,588,038 | 6/1971 | Tanaka | 4/623 X |
| 3,761,805 | 9/1973 | Dornberger | 324/677 |
| 4,149,231 | 4/1979 | Bukosky et al. | 324/678 X |
| 4,558,274 | 12/1985 | Carusillo | 324/677 |
| 4,743,837 | 5/1988 | Herzog | 324/678 X |
| 4,806,846 | 2/1989 | Kerber | 324/678 |
| 4,872,485 | 10/1989 | Laverty, Jr. | 137/624.11 |
| 4,972,070 | 11/1990 | Laverty, Jr. | 250/221 |
| 5,025,516 | 6/1991 | Wilson | 4/623 |
| 5,033,508 | 7/1991 | Laverty, Jr. | 137/624.11 |
| 5,159,276 | 10/1992 | Reddy, III | 324/678 |
| 5,294,889 | 3/1994 | Heep et al. | 324/678 |
| 5,329,239 | 7/1994 | Kindermann et al. | 324/678 |
| 5,461,321 | 10/1995 | Sanders | 324/678 |
| 5,570,869 | 11/1996 | Diaz et al. | 251/129.04 |

OTHER PUBLICATIONS

G.J. Teh, I. Dendo, W. H. Ko; "Switched Capacitor Interface Circuit for Capacitive Transducers", Transducers '85, 1985 International Conference on Solid–State Sensors and Actuators. Digest of Technical Papers (Cat. No.85CH2127–9). Philadelphia, PA, USA. pp. 60–63. IEEE. Electrochem. Soc. NBS. US Nat. Inst. Health. et al. 11–14 Jun. 1985.

M. Yamada et al., "A Switched Capacitor Interface for Capacitive Pressure Sensors", IEEE Transactions on Instrumentation & Measurement, vol. 41, No. 1, Feb., 1992, pp. 81–86.

Linear Technology, Inc., Application Note 3, Jul. 1985.

*Primary Examiner*—John Rivell
*Attorney, Agent, or Firm*—David Kiewit

[57] ABSTRACT

A capacitive field sensor, which may be used for the control of a water supply valve in a basin or fountain, employs a single coupling plate to detect a change in capacitance to ground. The apparatus comprises a circuit for charging a sensing electrode and a switching element acting to remove charge from the sensing electrode and to transfer it to a charge detection circuit. The time interval employed for the charging and discharging steps can vary widely. Usually at least one of the charge or discharge pulses is on the order of a hundred nanoseconds, and is shorter in duration than a characteristic conduction time for a body of water disposed about the sensing plate. Thus, the sensor can detect the presence of a user near a controlled faucet without being subject to measurement artifacts arising from standing water. In a controller for a water basin, a short charge or discharge pulse duration may be used when the controlled valve is closed, and a longer duration, which allows conduction through the water, may be used when the valve is open. The long duration measurement can detect the continued presence of the user as long as the user's hand remains in the stream of water.

63 Claims, 7 Drawing Sheets

TIME DOMAIN CAPACITIVE FIELD DETECTOR

BACKGROUND OF THE INVENTION

1. Field of the Invention

The present invention deals with capacitive field sensors employing a single coupling plate to emit and detect a field disturbance.

2. Description of Prior Art

Many methods of measuring capacitance are known to the art. Of relevance to the present disclosure are those inferring the value of a capacitor under test from measurements of the time required to charge or discharge the circuit element under controlled conditions. Notable among these are:

- U.S. Pat. No. 5,329,239, wherein Kindermann et al. disclose a microprocessor controlled multimeter charging an unknown capacitance from a constant voltage source when a first switch is closed and discharging it through a selected resistor when a second switch is closed.
- U.S. Pat. No. 5,294,889, wherein Heep et al. disclose a measurement circuit using a constant current source to discharge the unknown capacitor.
- U.S. Pat. No. 5,159,276, wherein Reddy describes a circuit for detecting leaks by measuring the capacitance of a permeable coaxial cable with a switched constant current source DC coupled to the cable Capacitive field sensors are commonly used in a wide variety of applications, such as security systems, door safety systems, human interfaces such as keypads, material handling controls, and the like. Such sensors can be divided into three broad classes: 1) those that emit and sense an electric field using separate coupling plates; and 2) those that employ a single coupling plate to emit and detect field disturbance; and 3) those that passively detect electric fields generated by, or present on, or ambient fields disturbed by, the object sensed.

Many existing sensors employing a single coupling plate employ AC field techniques, and connect the coupling plate to an AC source, such as an RF signal source. Fluctuations of the signal level at the coupling plate are monitored to detect the proximity of an object that absorbs the electric field. Various known sensors of this sort include:

- A sensor employing a capacitive bridge circuit to detect the signal fluctuations. In this case the bridge is used to suppress background capacitance and to allow for high gain amplification of the relatively small changes in the signals on the plate.
- A sensor placing the plate in a tuned circuit, so that changes in plate capacitance caused by moving proximate objects slightly alters the tuned circuit's resonant frequency, which may be monitored by various means.
- A sensor in which the plate is connected to an RC network, a time constant of which changes responsive to a change in capacitance on the plate. A variation of this type of sensor uses a fixed current source to charge the plate; and determines capacitance changes by measuring the changes in the charging rate from a reference slope. Commonly the rate is determined with the help of a voltage comparator and a reference voltage.

It is well known that sinusoidal AC signals are not a prerequisite for such sensors, and that other wave shapes can also be conveniently used, e.g. square waves or pulses, with the same essential effect.

Problems with existing designs include:

- emission of radio frequency interference—particularly with either pulsed or CW RF designs;
- susceptibility to external non-capacitive coupling, such as purely resistive paths from the plate to earth, which disturb the measurement process;
- high susceptibility to moisture in the region of the plate;
- inability to monitor small changes in the capacitance of large objects, or of objects providing large background capacitances;
- inability to automatically adapt to variations in the initial plate capacitance, especially if the overall possible range of such capacitance is large; and
- inability to tolerate adjacent sensor crosstalk.

Of the above cited problems, that of susceptibility to external non-capacitive coupling deserves special mention. While resistive paths to earth can sometimes be overcome by appropriate insulation or by a change in physical configuration of the sensing environment, in many instances this is simply not possible. For example, in controlling a water faucet with a sensor using the entire faucet as the plate, ambient water will cause an unpredictable and time-varying capacitance to earth. Because of water splashing around the base of the spout and because of conduction through the water in the pipe, this varying impedance will be present even if the pipe is plastic. In any prior art sensor such conduction paths—even though non-capacitive in nature—will effect the sensing circuit adversely. For example, if the sensor employs an RC circuit or variation thereof, the stray conduction path will rob the plate of charging current and will thus alter its apparent time constant. In tuned detection or bridge circuits, capacitive coupling to the plate will in and of itself become a fluctuating reactance in the presence of an external fluctuating conductance path, and will render the circuit worthless. Moreover, it is clear that there is no value of coupling capacitance for which this is not so.

The shortcomings of prior art capacitive sensors have led many designers of proximity control systems that need to function in the presence of water, or other weakly conducting liquid media, to employ sensors projecting an energetic beam into a sensing zone and measuring the reflection of that beam as an indicator of a user's presence. Such systems have employed visible and near-infrared light, microwaves, and ultrasonic acoustic projected beams. Notable among such prior art in the area of controlling water-supply equipment are:

- U.S. Pat. No. 5,033,508, U.S. Pat. No. 4,972,070 and U.S. Pat. No. 4,872,485, wherein Laverty teaches various aspects of infra-red control systems for the control of a water fountain;
- U.S. Pat. No. 5,025,516, wherein Wilson teaches a convergent optical beam arrangement for the control of a wash-basin water fountain.
- U.S. Pat. No. 5,566,702, issued Oct. 22, 1996, wherein the applicant in the present case teaches an adaptive infrared faucet controller responsive to both proximity and motion. The teachings of U.S. Pat. No. 5,566,702 are herein incorporated by reference.

SUMMARY OF THE INVENTION

The present invention cures the above defects in the prior sensing art, and provides a sensor operable with a wide variety of sensing plate configurations. Such a sensor can be connected to a wide variety of objects and is not limited to the use of a prefabricated plate. Such objects might include door mounted safety sensing strips, safety zone floor mats and strips, automatic faucets and water fountains, valuable fixed objects that are to be protected from theft or tampering, moving or flowing industrial materials, commodities having a variable level within a hopper or tank, etc.

The present invention employs the measurement of electric charge imposed upon, and shortly thereafter removed from, a sensing electrode (conventionally referred to as a "plate"). The sensing electrode may be an actual metal plate having a predetermined size and shape, or may be an entire conductive object, such as a faucet or a metal door. The time interval employed for the charge/discharge cycle can vary according to specific requirements. For example, it is known from experiment that sensing intervals of less than several hundred nanoseconds (ns) or less act to suppress the detection of localized amounts of moisture or standing water (the pulse width selected for this purpose will vary with the environment of the measurement, and is often less than one hundred nanoseconds). Larger measurement intervals will increasingly make such a sensor 'reach through' moisture and standing water (or 'through' internal water content in an object sensed), to detect what appears to be higher and higher levels of apparent capacitance. A 100 nsec duration is approximately optimal when sensing a user's hand proximate the spout of a wash-basin that may have water standing thereabout. Other objects may require different durations.

Apparatus of the invention comprises a circuit for charging a sensing electrode, and a switching element acting to remove charge from the sensing electrode and to transfer it to a charge detection circuit. Although the charging circuit may be as simple as a resistor or other type of current source, a better implementation uses a second switching element to charge the plate to a known voltage.

A preferred embodiment of the invention comprises a holding capacitor to measure the charge drained from the plate. In this embodiment, a microprocessor can collect a number of readings and perform signal averaging and non-linear filtering to effectively compensate for both impulse and stochastic noise, thereby allowing an increased effective gain of the sensor.

A charge subtractor is optionally employed to subtract charge from the holding capacitor, thereby increasing dynamic range and canceling offset effects that may be introduced from charge injection by the switch(es) or from background levels of plate capacitance and the wiring thereto.

In a preferred embodiment, algorithms stored in a computer memory are employed to provide for automatic calibration of the sensor, to track circuit drift, to track environmental changes, and to provide output processing as may be required for a particular application.

It is an object of the invention to provide capacitive sensing means for the control of a water delivery valve, the sensing means acting, when the valve is closed, to determine when the valve should be opened responsive to a user's approach, the sensing means acting, when the valve is open, to determine the duration during which the valve should be held open responsive to the user's continued presence proximate the valve.

It is an additional object of the invention to provide capacitive sensing means for the control of a water delivery valve, the sensing means comprising a capacitor plate DC-coupled to a charge measurement circuit.

It is yet a further object of the invention to provide capacitive sensing means for the control of a water delivery valve, the sensing means comprising a pulsed source of charging or discharging current, the pulse source supplying pulses of a different duration (or pulsewidth) when the valve is opened than when the valve is closed.

It is a still further object of the invention to provide capacitive sensing means for the control of a water delivery valve, the sensing means insensitive to the presence of standing water within a supply pipe or external to, but adjacent, the piping through which the water is delivered.

DESCRIPTION OF THE PREFERRED EMBODIMENT

Figure 1:
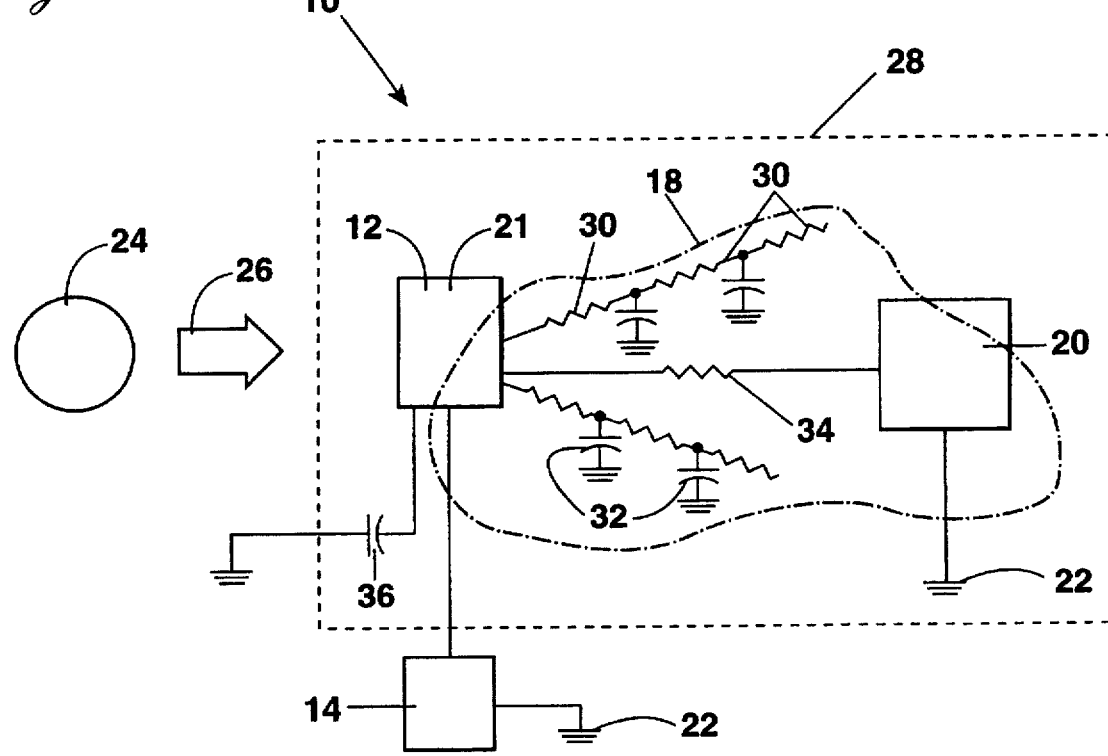
FIG. 1 of the drawing is an electrical schematic representation of a sensing plate surrounded by a water film providing an electrically conducting path from the plate to earth.

Turning initially to FIG. 1 of the drawing, one finds an electrical schematic of a sensing system of the invention 10 wherein a sensing plate 12 connected to a sensor circuit 14 by a wire or cable 16 is surrounded by a conductive water film 18 shown with a dash-dot line. The water film 18 is shown in contact with both a spout 21 of a water faucet and another metallic object 20 connected to an earth ground 22. That is, regardless of the physical details of the conduction processes, the sensing plate 12 is connected to a shunting conductor 18 having time-dependent conduction properties to be discussed in greater detail hereinafter. Also shown is an object 24 (which may be a person intending to use the spout 21), the object 24 approaching the plate 12 along a path indicated with the arrow 26 in FIG. 1. The plate 12, the water film 18, and the metal object 20 may be atop a nonconductive surface 28, depicted with a dashed line in FIG. 1. The schematic of FIG. 1 is representative of a water faucet being used as a bulk proximity sensor, wherein the pipe connecting the spout 21 to the water supply comprises a short piece of plastic tubing for electrical isolation, and where water splashes have accumulated as a film 18 disposed on a counter-top 28 around the base of the spout 21.

Figure 2:
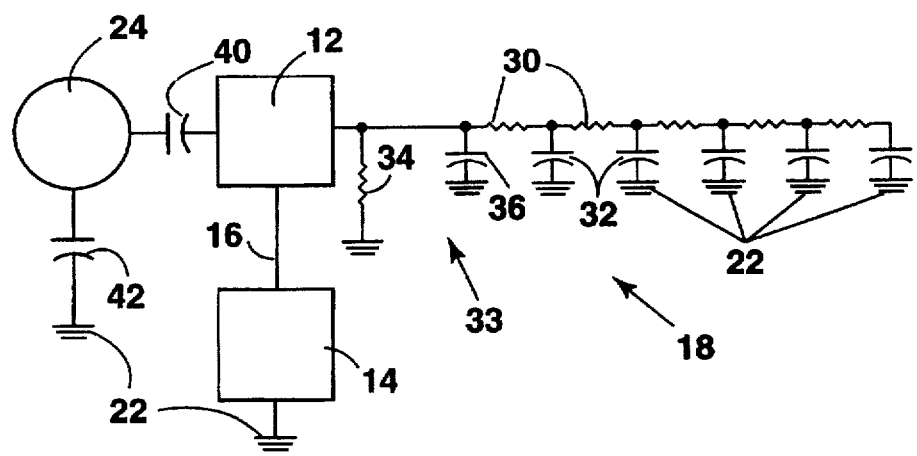
FIG. 2 of the drawing is a simplified electrical schematic view of the water film of FIG. 1.

A slightly different model of the electrical conduction and reactance paths around plate 12 and object 24 of FIG. 1 is shown in FIG. 2 of the drawing. As is well known in the electrochemical arts, a body 18 of water shunting the plate 12 to ground can be modeled as a two dimensional array of infinite series of resistors 30 and capacitors 32 connected between the plate 12 and earth 22. As shown in FIG. 2 of the drawing, the appropriate sensing model also includes a second conductive path 33 connecting the sensing plate 12 to earth 22. This second path comprises a parallel combination of a resistance 34 and a capacitance to earth 36. For modeling purposes, the infinite series can be conveniently reduced to an approximation shown in FIG. 2, where a finite series of resistors and capacitors 30 and 32 is shown. It should not be assumed from the numbering scheme that all resistors 30 or capacitors 32 are equal in value; they assuredly are not, and indeed vary considerably. The capacitance between the plate 12 and the object 24 (i.e., the electrical quantity to be detected by the sensor circuit 14) is represented in FIG. 2 with the reference numeral 40. It is also noted that the object 24 has a capacitance to earth 42, at least part of which is free space capacitance.

From this model it can be easily seen that there is a strong frequency dependence of the effective total capacitance measurable on plate 12. If an ac voltage is applied to the plate 12, at very low frequencies, the capacitors 32 can all charge and discharge fully on each sinusoidal cycle with little phase delay. At increasing frequencies, the capacitors 32 become increasingly difficult to charge through the resistances 30; that is, the RC network acts as a low-pass filter having an upper cut-off at a characteristic frequency—or, equivalently, there is a characteristic time constant for an ionic conductor such that the conductor will appear to not respond to pulsed signals having a duration significantly less than the time constant. Furthermore, the degree to which the capacitors 32 contribute to the measurable capacitance value of 12 is graduated from one extreme to the other. Only the fixed capacitances 36, 42, and 40 remain constant with respect to frequency. Thus, it appears that a capacitive proximity sensing approach that would achieve a desired independence from the effects of the incidental presence of an ionic conductor could be based on the use of short pulse durations in the detection circuit, the pulse durations being chosen to be short enough that the ionic species present do not contribute to the measurement (which, as noted supra, has been found to require pulses having a duration generally less than several hundred nanoseconds or so, and often less than one hundred nanoseconds). Moreover, as will be disclosed in greater detail hereinafter, operating the sensor at a plurality of frequencies or pulsewidths is advantageous in situations in which the amount of ambient water changes in a foreseeable way—e.g., a different charge and/or discharge duration may be preferred for sensing a user's approach to a faucet than for sensing the user's continued presence proximate the faucet.

Figure 3:
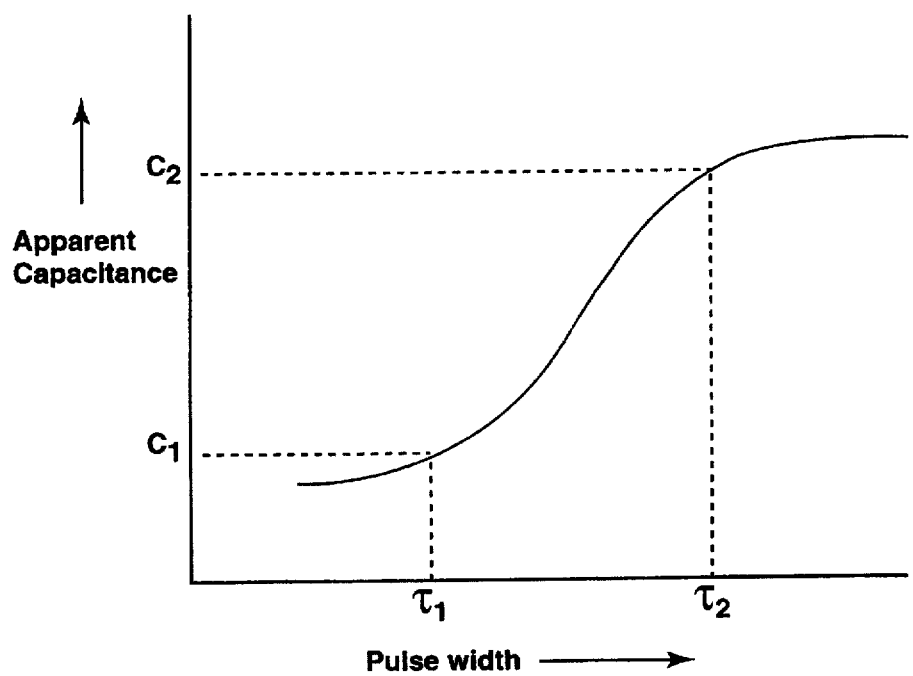
FIG. 3 of the drawing shows a curve characterizing the temporal response characteristics of a shunting conductor of interest.

Turning now to FIG. 3 of the drawing, one finds a curve illustrating the temporal response of a shunting conductor 18 of interest—e.g. a sheet or film of water spilled about a spout 21 or a portion of water contained in a pipe 41 intermediate a valve 43 and a spout 21. This temporal response was elucidated with pulsed capacitance measurements (using apparatus disclosed in detail hereinafter) and shows the apparent capacitance measured with pulses having a variety of durations. When the pulses used in the measurement are shorter than a first predetermined value, indicated as $\tau_1$ in FIG. 3, the shunting conductor 18 does not contribute to the measurement and the apparent capacitance value, $C_1$, is relatively low. When pulses longer than a second predetermined value, $\tau_2$, are used, the time-dependent shunting conductor 18 contributes to the measurement and a higher apparent capacitance, $C_2$, is observed. Both the values of $\tau_1$ and $\tau_2$ and the exact shape of the curve 45 are expected to depend on a variety of factors including the choice of geometry of the shunting conductor 18, the composition of the conductor (e.g., the salinity of water standing in a pipe), and the ambient temperature. Moreover, because the generally smooth and continuous nature of the response curve 45, a wide range of values for the pulse width can be selected for a given measurement. For a case of particular interest, that of water spilled about a spout 21, $\tau_1$ is on the order of 100 nsec, while $\tau_2$ is on the order of 1 μsec.

As noted supra, the resistance 34 between the sensing plate and earth 22 may be highly variable, depending on the purity and size of the water film 18 splashed about the plate 12 (which may be the spout 21) as well as depending on the degree of contact between the film 18 and a grounded conductor 20. This value may change from one moment to the next, and will also change with variations in ambient temperature. Even the bulk capacitance 36 between the sensing plate 12 and ground 22 may vary with time—e.g., if an additional object such as a paper towel is left draped over the spout 21.

Figure 4:
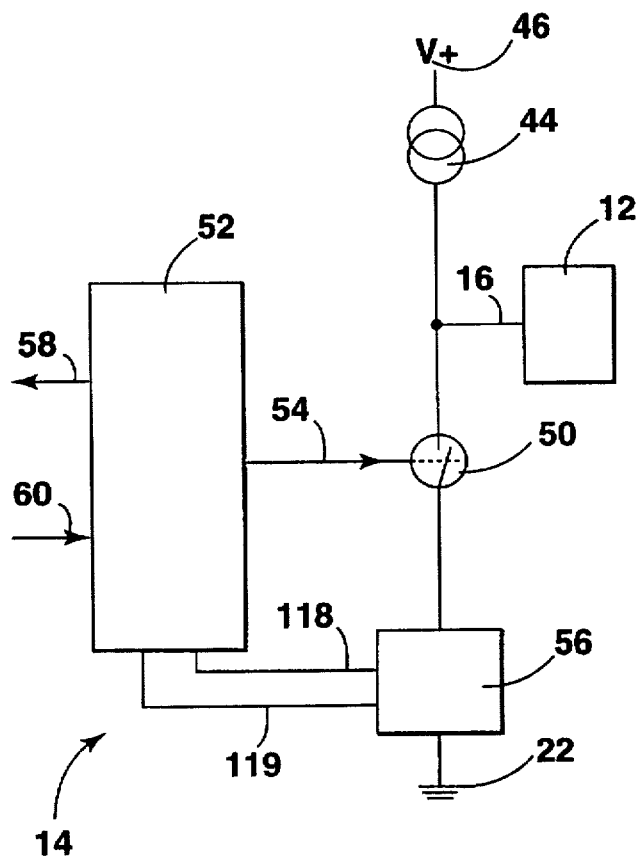
FIG. 4 of the drawing is a block diagram of a sensor having a single switch or switching element, a plate-charging circuit (which may be a resistor or other current source).

Turning now to FIG. 4 of the drawing, one finds a block diagram of one embodiment of the sensor 14 of the invention. In this embodiment a voltage-limited current source 44 (which in the simplest variation is simply a resistor connected to a fixed voltage source 46) feeds a charging current to the plate 12. The current supplied by the source 44 is selected so that the plate 12 is charged to a predetermined fraction of the supply voltage V+during a first interval during which a discharging switch 50 is open. At the end of the charging interval the discharging switch 50, which is preferably controlled by a microprocessor 52 via a control line 54, closes briefly. This rapidly discharges the sensing plate 12 into a charge detector 56, the amount of charge so transferred being representative of the capacitance of the sensing plate 12. The charge-discharge process can be repeated numerous times, in which case the charge measurement means 56 aggregates the charge from the plate 12 over several operating cycles. After a predetermined number of cycles of charge and discharge, the charge detector 56 is examined for total final charge by the controller 52, and as a result the controller 52 may generate an output control signal on an output line 58—e.g., which may be used to cause a faucet 21 to open. As is common in the control arts, the controller 52 may also comprise one or more control inputs 60, which may include sensitivity settings and the like. After each reading, the controller 52 resets the charge detector 56 to allow it to accumulate a fresh set of charges from the plate 12. Alternatively, the controller 52 can take a reading after each individual cycle of the discharging switch 50, and then integrate (or otherwise filter) the readings over a number of cycles prior to making a logical decision resulting in a control output. Also, as will be understood by those skilled in the art, various combinations of signal integration cycles by the charge detector 56 and by internal algorithmic processes in the controller 52 may be used.

The choice of time periods over which changes in capacitance are measured distinguishes between "proximity" and "motion" sensing methods. Proximity sensors are ideally those measuring a change in capacitance with respect to an invariant reference level. To avoid problems with component aging and drift effects, a practical adaptive proximity sensor is one measuring a change of capacitance with respect to a slowly varying reference level—e.g., a variation occurring over a time period significantly longer than the maximum time a user 24 would interact with a controlled mechanism. (A sensor of this sort is disclosed in the inventor's co-pending application 08/266,814.) Motion sensors, on the other hand, are those measuring only a rapid change in capacitance—e.g., those responsive to the absolute value of the algebraic difference between capacitance values measured at two instants exceeding a predetermined value. Correspondingly, motion sensors may be configured to average several readings taken during a requisite short sensing interval in order to avoid problems with noise.

It is noteworthy that there is no coupling capacitor between the sensor circuit 14 and the plate 12. In the presence of eternal conductances and reactances to earth such a coupling capacitor would inject its own reactance into the system, and the sensor would no longer merely be reading charge on plate 12, but would also be reading charge bled onto the coupling capacitor from other sources. The total charge measured in such an arrangement would vary with the values of the resistance 30 and capacitance 32 of the water film and with the direct resistance to ground 34 of the sensing plate 12.

It may be noted that the circuit of FIG. 4 is unable to handle cases in which the magnitude of the direct resistance to earth 34 is so low as to prevent the plate 12 from becoming fully charged. Calculations must be made to ascertain that this conductance path 34, if present, cannot interfere with valid signal readings by loading the current source 44. Also, since no provision is made in the circuit of FIG. 4 to shut off the current source 44, when the discharging switch 50 closes it will conduct charge from the source 44 into the charge detector 56 as well. This additional charge can usually be accounted for as a fixed offset.

Figure 5:
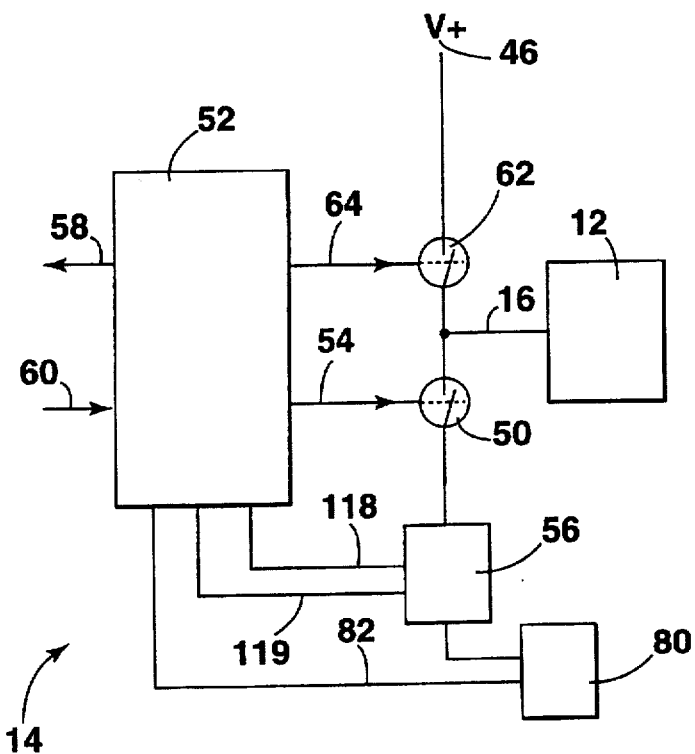
FIG. 5 of the drawing is a block diagram of a circuit similar to that of FIG. 3, but having a second switch to provide charging. An optional charge subtraction circuit is shown in phantom in FIG. 4.

A preferred embodiment of the invention is schematically depicted in FIG. 5. Here a second, charging, switch 62 is employed in place of the current source 44. The charging switch 62, like the discharging switch 50, is preferably a low resistance switching element, such as a transistor, operating under control of the microprocessor 52 via a charging control line 64, to charge the plate 12 very quickly to the known voltage V+. Should there be a conductive path offered by a low direct resistance 34, the current flow through the resistance 34 is not able to significantly drop the voltage impressed on plate 12, provided that the relative impedances of the direct resistance 34 and of the charging switch 62 are highly disparate.

Figure 6:
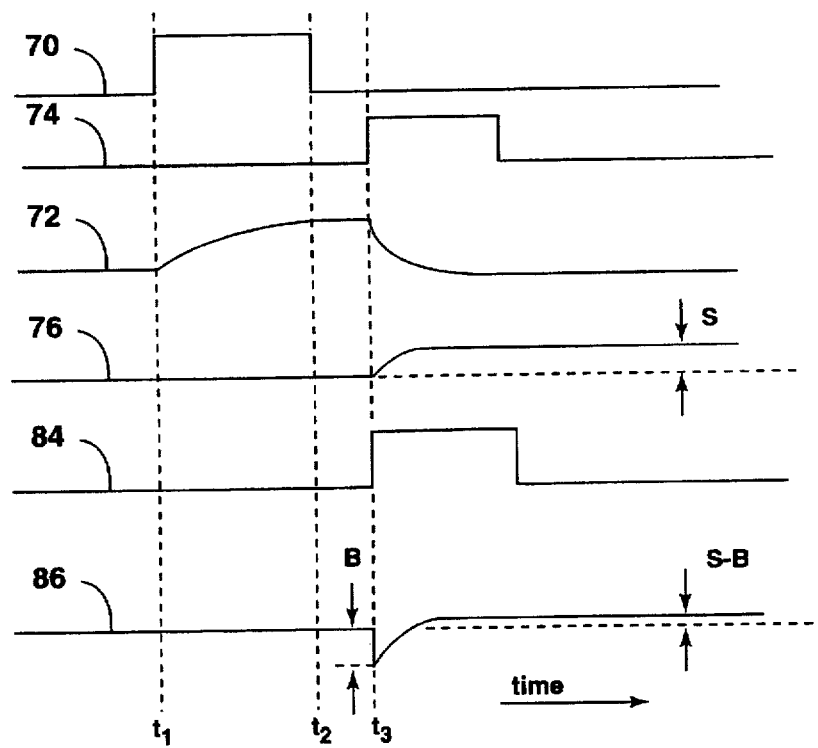
FIG. 6 of the drawing is a timing diagram showing control of the two switches of FIG. 5.

Turning now to FIG. 6 of the drawing, one finds a timing diagram depicting a preferred mode of closing and opening the charging 62 and discharging 50 switches in sequence. As shown by the top trace 70, the charging switch 62 closes at a first time, indicated as $t_1$, thereby connecting the plate 12 to the voltage source 46 so that the plate 12 charges quickly (as illustrated by a trace labeled with reference numeral 72) and reaches saturation at or before a second time $t_2$ (The rate of rise of the waveform 72 depends on the bulk capacitance of the plate 12, and the internal resistance of the charging switch 62) at which the charging switch 62 disconnects the plate 12 from the source of DC voltage 46. After a brief delay ($t_3$–$t_2$), which may be a few nanoseconds, and which is chosen to prevent switch crossover conduction, the discharging switch 50 (shown in waveform 74) closes at $t_3$, thereby connecting the plate 12 to the charge measurement means 56 so as to rapidly discharge the plate 12. The waveform labeled with reference numeral 76 shows the rise of charge in the charge detector 56 after the discharging switch 50 closes.

Because the switches 62, 50 have intrinsic internal capacitances which inject charge into the charge detector 56, and because the plate 12 may have a very large inherent capacitance 36, it is often desirable to cancel these charges as fully as possible to prevent saturating the charge detector 56 with these background signals. To this end, a charge subtractor 80 is provided in some embodiments of the invention. When pulsed by a buck line 82 from the controller 52 (shown as waveform 84 in FIG. 6) the charge subtractor 80 subtracts charge from the charge detector 56. With such a circuit, the output of the charge detector 56 would look like waveform 86 of FIG. 6, rather than like waveform 76. Because only the charge detector's offset is affected by the charge subtractor 80, there is no change in gain of the charge detector and the overall system sensitivity remains unaffected.

The effect of the circuit of FIG. 5 in wet environments is to prevent capacitors 32 from charging very much, because they are resistively coupled by resistors 30 and the charge pulse 70 is short. Likewise, during the discharge pulse 74, any charge on the capacitors 32 will have difficulty in being conducted through the resistors 30 in time to measurably affect the charge on the charge detector 56. By rapid charge and discharge, the effect of resistances 30 is to remove the parasitic capacitances 32 from the measurement, while the bulk capacitances 36, 42, and 40 are always measured. Similarly, the direct resistance 34 plays an insignificant role, because the discharge occurs fast enough and immediately follows the charging pulse, the tendency is for the charge not to be bled away by the resistor 34 in time to significantly affect the measured result. AC coupling the sensor circuit 14 to the plate 12 by placing a conventional blocking capacitor (not shown) in the line 16 would destroy all these advantages by injecting a new reactance into the system. The effects of this reactance would be highly dependent on variations in circuit elements 30, 32, 34 that one wishes to exclude from the measurement. Thus, the system must remain DC coupled to be effective in wet environments.

It is noteworthy that the method of the invention can involve controllably charging and discharging a sensing plate 12 where at least one of the charging and discharging steps is done during a time interval shorter than a characteristic conduction time of a shunting conductor. In the preferred embodiments, both the charging and discharging steps are carried out with fast pulses. The discussion supra with respect to FIG. 4 of the drawing, however, presented an arrangement in which a long (essentially infinite) charging step was combined with a short discharging interval. The complementary situation, that of using a brief charging interval combined with a long discharge period would also be effective to provide a means of making a reproducible capacitance measurement usable for control applications in the presence of a shunting conductor 18.

Figure 7:
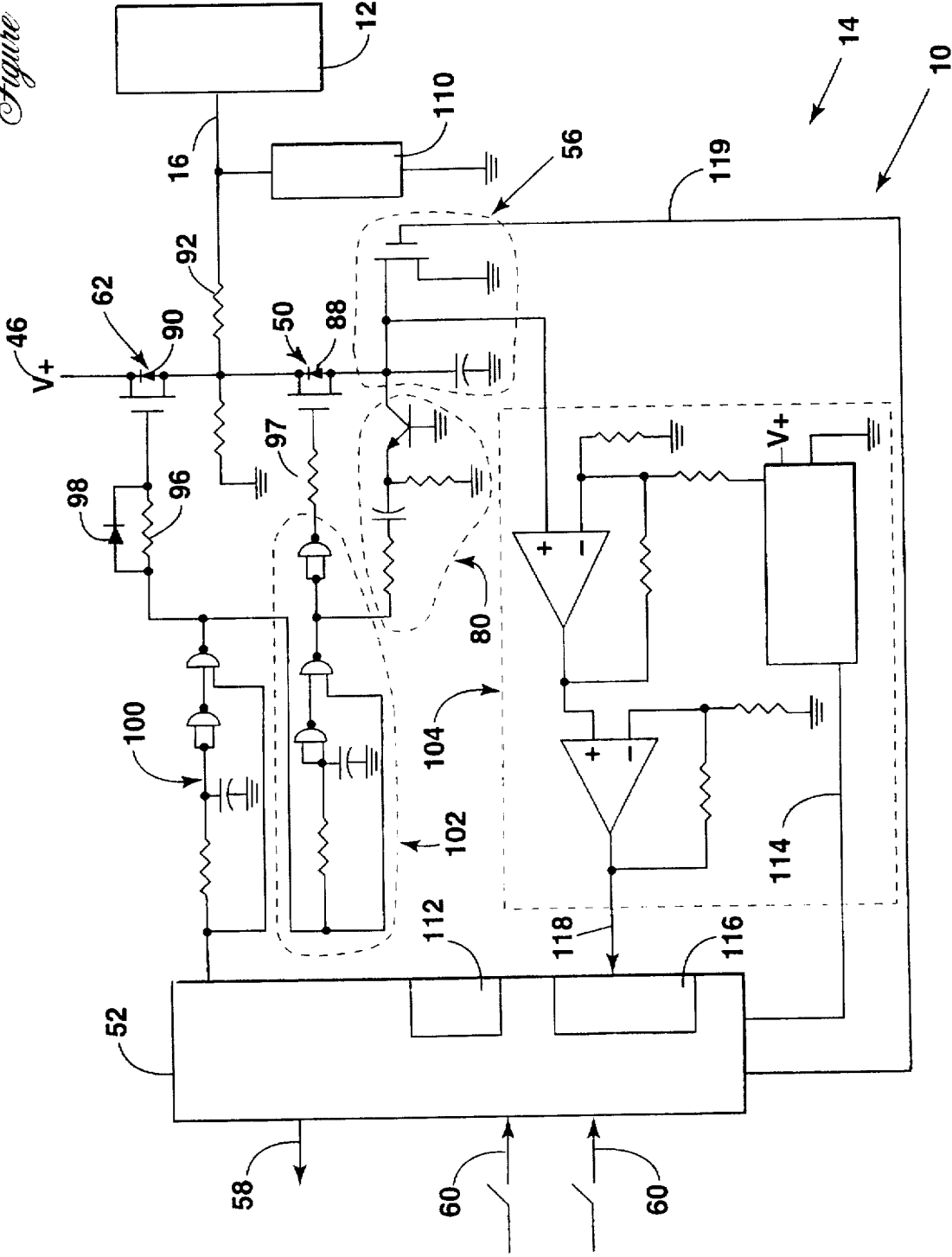
FIG. 7 of the drawing is a detailed circuit schematic of a sensor conforming to FIG. 5

FIG. 7 shows a schematic circuit diagram of an actual circuit employed to sense proximity of a user 24 to a faucet. In this embodiment the switches 62 and 50 are p- and n-channel mosfet transistors of types BSS110 and BSN10, respectively, both of which have integral source-drain diodes 88, 90. A resistor 92 (which typically has a value of twenty four ohms) adds damping and prevents ringing in the line 16 running to the plate 12. A second resistor 94 (which has a typical value of fifty one thousand ohms) acts to drain residual charge from the plate 12 when neither of the switches 62,50 is conducting. Radio frequency interference is minimized by the provision of resistors 96,97 (which preferably have values of about one hundred ohms) to limit the rise and fall times of the signal on the cable 16, by limiting the gate charge rate on the switches 62 and 50. A diode 98 is preferably provided to turn off the charging switch 62 abruptly prior to the discharging switch 50 turning on a few nanoseconds later. Pulse networks 100, 102, which preferably employ 74 AC00 type nand gates for pulse forming and driving, generate approximately 100 ns pulses (i.e., waveforms 70, 74, where waveform 70 is inverted)) for the charging 62 and discharging 50 switches. Because the pulse network 102 acts subsequently to the network 100, its output pulse is slightly delayed. The charge subtractor circuit 80, in this embodiment, employs an NPN transistor (preferably a type 2 N918) to subtract charge from the charge detector 56 on every pulse edge. The choice of the capacitance value in the charge subtractor 80 and of the system voltage determine the amount of charge subtracted on each pulse. In addition, an amplifier circuit 104 (having a gain of approximately two hundred and six in a preferred case), is used with an 8-bit DAC to provide an adjustable measurement offset of the signal. The analog to digital converter 116 integral to the preferred microcontroller 52 (a type PIC16C74) is only 8-bits, and thus has limited dynamic range. By adding a large external gain with offset capability, the system obtains an 8-bit 'window' subrange into a 13-bit measurement space (3 offset bits are used for overlap within each 8-bit window subrange).

The preferred charge detector 56 is merely a comprises 106, which has a value of 0.05 μF in one embodiment. A reset mosfet transistor 108, preferably of type BSN10, is used to reset the charge detecting capacitor 106 after each pulse, or burst of pulses, used in a measurement is read through the amplifier subsystem 104. Because the discharging switch 50 is preferably implemented as a mosfet having an internal diode 88, it is important not to allow the voltage on the charge detecting capacitor 106 to rise beyond about 0.5 volts, lest excessive conduction leakage occur, which would reduce the effective gain. If the voltage on the charge detecting capacitor 106 rises too high, the charge subtractor circuit 80 should be modified to provide more charge subtraction for each pulse, and/or the charge detecting capacitor should be increased in value. The latter approach will spoil gain as well, but will increase the tolerable load capacitance range.

Optionally, an electrostatic discharge protection device 110 can be used to prevent damage to the circuit from body static. It may be composed of one or more conventional diodes, a zener diode, or other clamping element.

In operation, the controller 52 operates according to the settings of switches on the control input lines 60 for sensitivity, time delays, and the like. A program stored in read only memory 112 governs the operation of the microprocessor. Periodically, for example once every ten milliseconds, the controller 52 issues a command to pulse-generating circuit 100, causing one or more pairs of successive pulses 70 (inverted) and 74 to be applied to the two mosfet switches 50, 62. These pulse-pairs may be supplied singly, or as burst of pulse pairs issued within a short time (e.g., several tens of microseconds), depending on the measurement environment. The controller issues the appropriate measurement offset on appropriate control lines 114, and after a brief delay to allow the circuit to settle, an analog to digital converter (ADC) 116 integral to the controller 52 digitizes the voltage on an input line 118 and thereby supplies a digital representation of the charge aggregated in the charge measurement means 56 to the controller 52. Following this, the reset line 119 is asserted and the reset mosfet 108 resets the detecting capacitor 106.

Internally to the controller 52, the digital output data from the ADC 116 may be averaged with prior and future samples of the signal. If an appropriately averaged result exceeds a predetermined threshold value, an output on the control line 58 may be asserted as long as the condition persists. Of course, other known output processing options may also be employed. One could, for example, use a one-shot at the output; delay the output by some period; provide an output having a maximum duration; etc. Moreover, the decision algorithms carried out by the controller 52 may also be selected from many known forms, including digital (Z-transform) filters, boxcar averaging, peak detection, peak suppression, median filtering, and the like. Newer forms of heuristic processing that depend on signal strength, change, and history, such as fuzzy logic, may also be employed.

Although specific methods have been detailed herein for creating the various circuits, it can be readily appreciated that there exist many known alternative means for implementing them. For example, although the charge detector 56 can be implemented using more complex circuits involving current mirrors and various types of integrators, the essential function remains the same. Likewise, the charge subtractor 80 may be implemented in an alternative manner. The amplifier sub-circuit 104 is not an essential circuit. It can be replaced with an analog to digital converter 116 of sufficient resolution and speed. Even the controller 52 functionality can be implemented in either digital or a combination of digital and analog hardware, as opposed to being a microprocessor, and in any such form would still be well within the spirit and scope of the invention.

Spectrally the RF field generated by the sensor is heavily bandwidth limited due to the rise and fall time limitations imposed by the resistors 96, 97 connected to the gates of the charging 62 and discharging 50 switches. Additionally, the spectral output is extremely broad, flat, and weak because the repetition rate is typically very low, the pulse spacing wide, and the currents and voltages very low. There are no resonant circuits to boost currents and voltages, and there are no pronounced spectral peaks. Even though rise and fall times may approach 20 ns, a pulse spacing of 10 ms gives a fundamental frequency of 100 Hz. By employing time-domain pulse techniques, the spectral output of the sensor 10 is widely spread and weak. It is difficult to detect beyond a few feet.

An additional advantage of the invention is that it permits multiple units to be employed in near proximity without cross interference. This favorable result arises because the pulse density is so low. Pulse spacings can be made pseudo-random or simply different so as to avoid interference. The probability of two single pulses from adjacent ones of the preferred sensor occurring at the same instant is about 100 nsec/10 msec or 1 chance in 100,000. Even if multiple pulse bursts having 50 pulses per burst are used, the odds are 1 in 2,000. Assuming a 'direct hit' between two adjacent units, software algorithms can completely ignore the singular false data point (e.g., with a median filter).

As has been noted previously, it is most advantageous to couple the circuit 14 to the plate 12 without a blocking capacitor. The issue of plating caused by electrolytic current from the sensor is a natural attendant concern, but in the preferred embodiment the average current and voltage are so minuscule as to be overwhelmed by natural currents caused by dissimilar metals electrolysis. If a five volt system uses 100 nsec pulses every 10 ms (i.e., a duty cycle of or 1 part in 100,000), a quick calculation reveals that in twenty years the total plating time exposure to the five volt source will be 1.8 hours. The measured resistance through water, for example in the case of a faucet, can be as low as ten thousand ohms to ground, most of which is through a short section of water contained in the plastic pipe 41 feeding the spout. The current at 5 volts will be no more than 500 μA, for a net plating exposure of under 0.9 mA-hr., which is far below any reasonable level of concern.

Another concern which may be raised is that of electrical exposure to the human body, especially in wet environments. At the duty cycles used, the average voltage is roughly 1300 μV, which is inconsequential. In a worst case sensor failure, one might produce an unblocked 5 volt signal on the plate. This voltage is less and far more current limited than that commonly available from a 9 volt transistor battery or a 12 volt car battery, which are accepted as not being capable of causing a shock hazard even in wet environments.

EXAMPLE

Control of a Water Fountain

Figure 8:
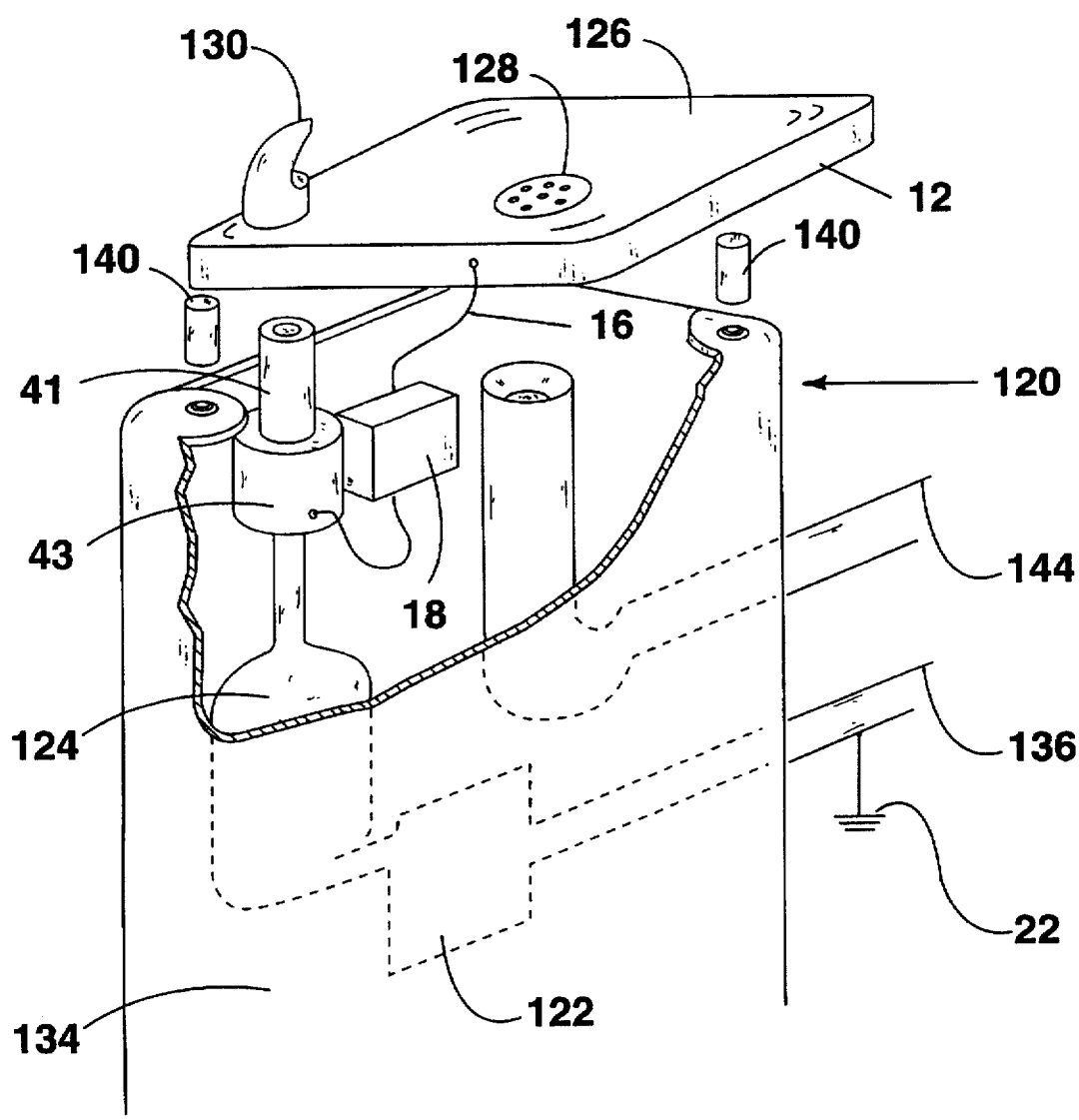
FIG. 8 of the drawing is a partially cut away elevational view of a drinking fountain controlled by apparatus of the invention.

Turning now to FIG. 8 of the drawing, one finds a drinking fountain 120 comprising electrically-powered refrigeration equipment 122 to cool water, and a tank 124 to store cooled water for dispensing. Fountains of this sort conventionally are of mostly metallic construction, comprising a stainless steel or heavily plated metal basin 126 having a drain connection 128 at a low point thereof, and having a spout 130 (which is conventionally called a bubbler in the water fountain art) arranged to spray water in a arcuate path thereinto when a solenoid-operated valve 43 is opened. For safety purposes, electrical components—e.g., the chiller 122 and the solenoid valve 43—are grounded (e.g., by connecting a metal case 134 of the fountain 120 to an inlet metallic cold water line 136). It will be understood that alternate grounding means (e.g., connecting a chassis of a fountain 120 having a plastic case 134) can be employed.

It is known in the prior art to provide motion or presence sensors for water fountains—e.g., the teachings of Laverty in U.S. Pat. No. 5,033,508 and U.S. Pat. No. 4,872,485. But prior art controllers (which have mostly relied on the use of projected infra-red beams to define a sensing area) have been excessively sensitive to motion in the general area of the fountain and have tended to turn on when someone walks by, unless time delays are supplied to ensure that an approaching person stays near the fountain long enough to be considered a prospective user. Such time delays are frequently perceived as a nuisance by thirsty people who may have to wait for the time-outs before being able to drink. Capacitive sensing is not known to have been employed for the control of such equipment due to the inability of prior art capacitive measurement apparatus to deal with varying impedances associated with water splashing about the fountain.

The present invention provides an automatic control system and method for a modified water fountain that supplies water when a user approaches the basin 126 and bubbler 130 of a structurally modified water cooler and brings some portion of his or her body (e.g., the mouth or a hand) close to the basin 126 or bubbler 130 from above. A water fountain 120 made in accordance with the invention measures change in the capacitance between the basin 126 and the 24 user as he or she approaches. This system has been shown to provide sensing means for a water fountain that will hold the delivery valve 43 open as long as the user is present. In using the apparatus of the invention to control a water fountain 120, one first breaks all metallic paths connecting the basin to earth, leaving one with only the parasitic ionic conduction paths connecting the basin 126 to ground. As disclosed hereinbefore, the system and apparatus of the invention are effective at overcoming the effects of these conduction paths. In a preferred embodiment, insulating standoffs 140 are interposed intermediate the basin 126 and the grounded case 134 or chassis of the fountain 120; a section 41 of the inlet piping, intermediate the solenoid valve 43 (which has a grounded housing) and the bubbler 130, is made of a suitable electric insulator. A portion of the drain line 144 adjacent the basin 126 is also made of an insulating material. It may be noted that the use of plastic pipe intermediate the valve 43 and spout 130 and the use of plastic drain pipe for the drain line 144 are common in the prior art, so that the principal structural modification to a prior an water cooler 120 is to provide electric insulation intermediate the case 134 and basin 126 so that the basin 126 (or the combination of the basin 126 and bubbler 130) can act as the sensing plate.

EXAMPLE

Controlling a Wash-Basin Faucet

Figure 9:
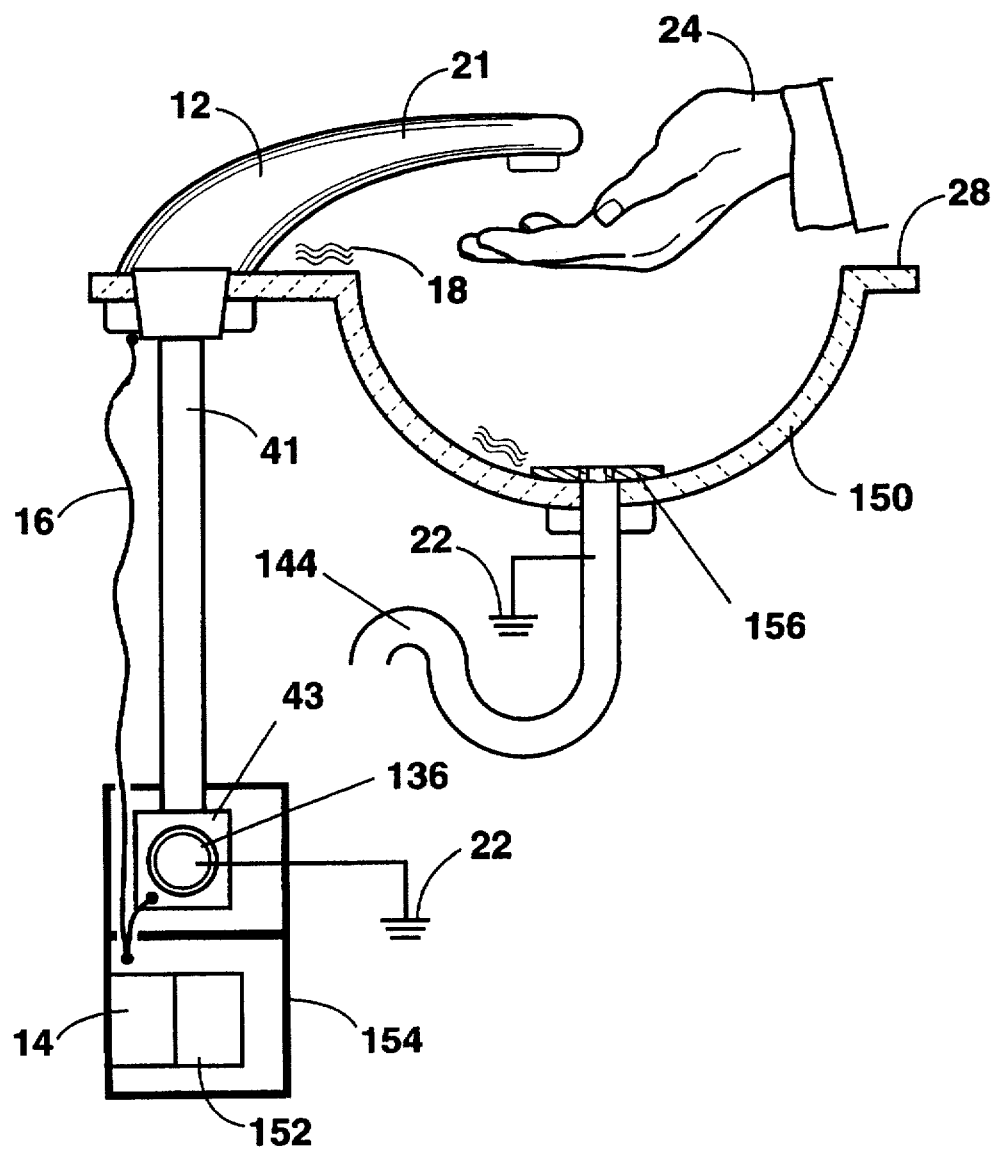
FIG. 9 of the drawing is a cut-away view of a sensor of the invention controlling water flow through a wash-basin faucet.

Turning now to FIG. 9 of the drawing one finds a partially sectional view of a wash basin 150 mounted in a counter 28 and having a metallically conductive body, the body comprising both the water spout 21 and the sensing capacitor plate 12. A drain line 144 is attached to the basin 150 in a conventional manner. The spout 12 is plumbed to an electrically operated valve 43 controlled by a sensor circuit 14 conveniently installed with the valve 43 and a battery 152 in a tamper-resistant enclosure 154 such as the one disclosed by the inventor in his U.S. application Ser. No. 08/458,429. A dielectric tubular member 41 (which is usually a piece of plastic pipe, but which may be configured as a gasket, as an O-ring interposed between two metal pipes, or in some other form known to the art) connects the spout 21 and the valve to ensure that there is no metallic conductive path between the spout 21 and an electrical ground 22 (e.g., as may be provided by a metallic inlet pipe 136). In the dual pulse width embodiment of the invention described hereinafter, the metallic drain strainer 156 or pop-up drain closure (not shown) is grounded. The spout 21, electrically connected to the sensor circuit 14 by a wire 16, serves as the sensing plate 12 for detection of an object 28 (such as a user's hand 24) proximate the spout 21.

Figure 10:
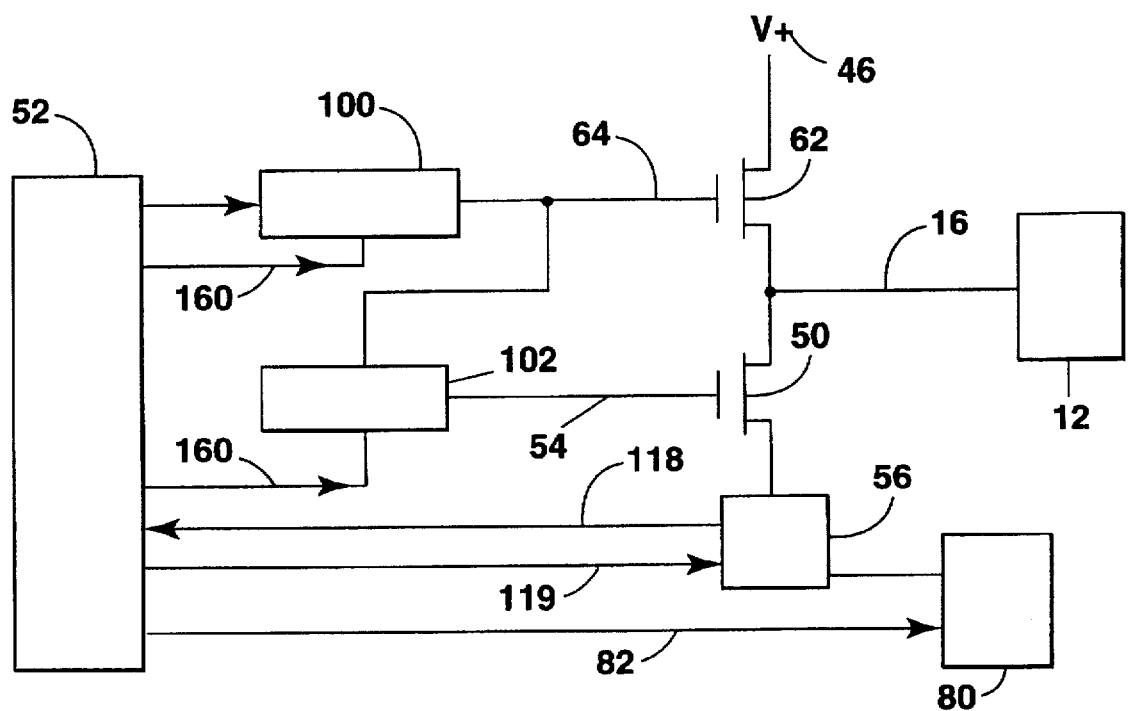
FIG. 10 of the drawing is a schematic block diagram of an embodiment of the sensor of the invention that includes circuits to allow the modification of pulse durations, which is useful in the control of water-basin faucets.

A schematic view of a dual pulse-width circuit embodiment preferred for use in controlling the faucet of a wash basin is illustrated in FIG. 10. An essential feature of the dual pulse width embodiment is means 160 permitting the controller 52 to alter the pulsewidths applied to the charging 62 and discharging 50 switches. By using two or more pulse widths, it is possible for the controller 52 to learn more about the object being sensed 28 than simply proximity. For example, in the case of a faucet, a short pulse width can be used during quiescent periods when the valve 43 is closed. Short pulse widths are optimal for detecting the approach of a person's hands, as they ignore signals from water splashes 18 around the spout 21. Once the water is turned on, the sensor 10 can switch to a wide pulse width and use the low-pass electrical characteristics of the water to 'reach through' the water stream itself to the user's hand 24, and thereby to sense whether it is in the water stream. This is a useful feature because many people reach deeply into the basin 150 while washing—i.e., their hands 24 are farther from the spout 21 while they wash than when waved near the spout 21 to initiate water flow. It has been experimentally determined that the signal detected from a person in this manner is quite large, and in fact is much larger and more variable than that from water splashes. Thus the sensor 10 can easily determine that the user is still making use of the water stream. It is noteworthy, however, that the drain strainer 156 or other metallic body at the base of the basin 150 must be grounded if wide pulses are to be used. If this is not done, the large signal component associated with the drain elements 144, 156 swamps the signal due to the user's hand 24 and the water, once turned on, continues to run. Once the water solenoid is turned off, a narrow pulse is again used to detect a user's approach with great selectivity. In cases where only the narrow pulse width is employed, it is of no consequence whether the drain screen 156 is grounded or not, as the sensor 10 will ignore the effects of water, while responding to the user's hand 24 being near the spout 21. In such single pulse width system, of course, the user's hand 24 would have to remain near the spout 21 in order to keep the water flowing.

As a minor variation of the circuitry depicted in FIGS. 7 and 10, it should be pointed out that variable pulse widths can be obtained by using a suitably fast microcontroller 52 and synthesizing the pulsewidths directly in software. Alternatively, digital hardware can be used to create variable length widths based on multiples of a clock interval. Battery operation of the sensor 10 can be simply obtained by employing a power switch to de-power various circuits elements (such as amplifier circuit 104) during the relatively long waiting periods between low duty cycle pulses, and putting the controller 52 into a sleep mode to conserve power between pulses. In practice, a sensor circuit would include various means to drive a solenoid valve, relay, motor, or other device from an output line 58; such circuits are highly application dependent and are well known in the industry. Moreover, the control inputs 58 can take many forms, as is well known in the trade.

Although the present invention has been described with respect to several preferred embodiments, many modifications and alterations can be made without departing from the invention. Accordingly, it is intended that all such modifications and alterations be considered as within the spirit and scope of the invention as defined in the attached claims.

What is desired to be secured by Letters Patent is:

1. Apparatus for measuring the capacitance to ground of a plate, the plate electrically connected to the ground by a shunting conductor that is not a part of the apparatus, the shunting conductor substantially conducting electrical current pulses having durations greater than a first predetermined value, the shunting conductor substantially not conducting current pulses having durations less than a second predetermined value, the apparatus comprising:
   a source of DC current charging the plate;
   a source of a voltage pulse having a duration less than the second predetermined value;
   a discharging switch having an open state and a closed state, the discharging switch moving from its open to its closed state responsive to the voltage pulse, the discharging switch connecting the plate to a charge measuring means when in the closed state, the discharging switch otherwise not connecting the plate to the charge measuring means.

2. Apparatus of claim 1 wherein the shunting conductor comprises water.

3. Apparatus of claim 1 wherein the charge measurement means comprises a capacitor and wherein the discharging switch comprises a transistor.

4. Apparatus of claim 1 further comprising a microprocessor having an input from the charge measurement means, the microprocessor acting under control of a stored program to control the source of the pulse to close the discharging switch a predetermined number of times, thereby aggregating charge in the charge measurement means, the microprocessor subsequently receiving the input.

5. Apparatus of claim 1 further comprising a microprocessor acting under control of a stored program to control the source of the pulse to close the discharging switch a predetermined number of times, wherein two sequential ones of the times are separated by an interval of pseudo-random duration.

6. Apparatus for measuring a capacitance to a ground of a plate, the plate electrically connected to the ground by a shunting conductor that is not part of the apparatus, the shunting conductor conducting electrical current pulses having durations substantially greater than a first predetermined value, the shunting conductor not conducting current pulses having durations substantially less than a second predetermined value, the apparatus comprising:
   a source of dc voltage;
   pulse generating means generating a charging pulse and a subsequent discharging pulse, at least one of the charging and the discharging pulses having a duration less than the second predetermined value;
   a charging switch having an open state and a closed state, the charging switch moving from its open to its closed state responsive to the charging pulse, the charging switch connecting the voltage source to the plate when in its closed state, the charging switch otherwise disconnecting the voltage source from the plate;
   a discharging switch having an open state and a closed state, the discharging switch moving from its open state to its closed state responsive to the discharging pulse, the discharging switch connecting the plate to a charge measuring means when in its closed state, the discharging switch otherwise not connecting the plate to the charge measuring means;
   whereby a quantity of charge representative of the capacitance of the plate is transferred to the charge measurement means.

7. The apparatus of claim 6 further comprising a controller having an output responsive to a change in the measured capacitance, the change associated with motion of an object proximate the plate.

8. The apparatus of claim 6 wherein the charge measurement means comprises a charge detecting capacitor.

9. Apparatus of claim 8 further comprising an analog to digital converter electrically connected intermediate the charge detecting capacitor and a microprocessor, the analog to digital converter controlled by the microprocessor to provide a digital representation of a voltage across the detection capacitor.

10. The apparatus of claim 9 further comprising a charge subtractor controlled by the microprocessor to subtract a predetermined quantity of charge from the charge detecting capacitor.

11. The apparatus of claim 8 wherein the charge measurement means further comprises a reset transistor and wherein both the charging and the discharging switches comprise transistors.

12. Apparatus of claim 6 further comprising means controlling the pulse generating means to supply a predetermined number of the charging pulses and the predetermined number of the discharging pulses, each of the discharging pulses being generated subsequent to one of the charging pulses and before the next sequential one of the charging pulses, whereby the charging and discharging switches close in sequence the predetermined number of times.

13. Apparatus of claim 6 wherein the shunting conductor comprises water spilled about a spout and wherein the charge measurement means supplies an input to a controller having a stored value representative of a predetermined value of the input, the controller providing a control output controlling an electrically-actuated valve to open when the input exceeds the predetermined value, the valve, when open, supplying water to the spout.

14. Apparatus of claim 13 wherein the spout comprises a bubbler portion of a water fountain, wherein the plate comprises a metallic basin of the water fountain, the basin having no metallic electrical connection to a grounded metallic portion of the water fountain.

15. Apparatus of claim 13 wherein a metal body adjacent a wash-basin comprises the spout and the plate, the apparatus further comprising a dielectric tubular member conveying water from the valve to the spout.

16. Apparatus of claim 6 wherein the charging pulse has a duration less than the second predetermined value.

17. Apparatus of claim 16 wherein the discharging pulse has a duration less than the second predetermined value.

18. Apparatus of claim 6 wherein the discharging pulse has a duration less than the second predetermined value.

19. Apparatus of claim 6 further comprising means controlling the pulse generating means to supply a predetermined number of the charging pulses and the predetermined number of the discharging pulses, each of the discharging pulses being generated subsequent to one of the charging pulses and before the next sequential one of the charging pulses, whereby the charging and discharging switches close in sequence the predetermined number of times.

20. Apparatus of claim 19 further comprising means controlling the pulse generating means to wait an interval having a pseudo-random duration subsequent to the charging and discharging switches closing in sequence the predetermined number of times and to thereafter again supply the predetermined number of the charging and the discharging pulses.

21. A method of operating a sensor, the sensor responsive to a change in the capacitance to a ground of a plate that is connected to the ground by a shunting conductor that is not a portion of the sensor, the shunting conductor conducting electrical current pulses having durations substantially greater than a first predetermined value, the shunting conductor not conducting current pulses having durations substantially less than a second predetermined value, the method comprising the steps of:

a) closing a charging switch to connect the plate to a source of charging voltage for a charging interval having a predetermined charging duration and thereafter opening the charging switch to disconnect the plate from the voltage source;

b) closing a discharging switch to connect the plate to a charge measurement means having an output representative of the electrical charge transferred thereinto, the plate connected to the charge measurement means for a discharging interval having a predetermined discharging duration, and thereafter opening the discharging switch; and c) reading the output of the charge measurement means, wherein at least one of the charging and discharging durations is less than the second predetermined value.

22. The method of claim 21 wherein both the charging duration and the discharging duration are less than the second predetermined value.

23. The method of claim 21 wherein the step of closing the discharging switch is carried out only after the charging switch has been opened to disconnect the plate from the voltage source.

24. The method of claim 21 comprising an additional step b1 intermediate step b) and step c) of repeating steps a) and b) a predetermined number of times before carrying out step c).

25. The method of claim 21 comprising additional steps b1 and b2 intermediate steps b) and c) of:
b1) waiting for a delay time interval having a duration less than the first predetermined value, and
b2) repeating steps a), b) and b1) a predetermined number of times before doing step c).

26. The method of claim 24 comprising additional steps b1 and b2 intermediate steps b) and c) of:
b1) waiting for a delay time interval having a duration greater than the first predetermined value, and
b2) repeating steps a), b) and b1) a predetermined number of times before doing step c).

27. The method of claim 21 wherein the charge measurement means comprises a charge detecting capacitor, and wherein step c) comprises the substeps of: c1) connecting the charge detecting capacitor to an analog-to-digital converter; c2) digitizing the magnitude of a voltage on the detection capacitor; and c3) communicating the digitized voltage to a microprocessor.

28. Apparatus for measuring a change in capacitance between a sensing plate and an electrical ground, the change in capacitance operatively associated with the presence of a user proximate the plate, the apparatus comprising control means for controlling the actuation of an electrically-operated valve supplying water to a spout, the apparatus comprising:

the sensing plate;
a means of generating electrical pulses;
a source of DC voltage;
a charging switch intermediate the voltage source and the plate, the charging switch having a closed state electrically connecting the source to the plate and an open state electrically disconnecting the source from the plate, the charging switch switching between the closed and the open states responsive to a first pulse from the pulse generating means;
a discharging switch intermediate the plate and a charge measuring means having an output, the discharging switch having a closed state electrically connecting the plate to the charge measuring means and an open state electrically disconnecting the plate from the charge measuring means, the discharging switch switching between the closed and the open states responsive to a second pulse from the pulse generating means;
wherein the control means comprises means for storing a predetermined electric charge value, the control means receiving the output of the charge measuring means and controlling the valve to be open if the output from the charge measuring means is greater than the predetermined charge value, the control means otherwise controlling the valve to be closed.

29. Apparatus of claim 28 wherein the spout comprises a water fountain bubbler, wherein the plate comprises a portion of a basin of the water fountain, the basin of the water fountain having no metallic conducting path to a grounded metallic portion of the water fountain.

30. Apparatus of claim 28 further comprising a dielectric tubular member connected intermediate the valve and a metal body, the metal body comprising both the spout and the capacitor plate, the metal body electrically connected to the controller.

31. Apparatus of claim 30 wherein the first pulse has a first duration when the valve is closed and a second duration, longer than the first duration, when the valve is open, and wherein the second pulse has a third duration when the valve is closed and a fourth duration, longer than the third duration, when the valve is open.

32. Apparatus of claim 28 wherein the control means comprises means replacing the stored predetermined charge value with a second stored predetermined charge value responsive to an input representative of a change in an ambient condition.

33. A method of measuring the change of capacitance to ground of a conducting plate and of controlling the actuation of an electrically-operated valve supplying water to a spout responsive to the measured change, the method comprising the steps of:

a) closing a charging switch and thereby connecting the plate to a source of dc voltage for a charging interval having a first predetermined duration;

b) opening the charging switch at the conclusion of the charging interval;

c) closing a discharging switch and thereby connecting the plate to a charge measurement means for a discharging interval having a second predetermined duration;

d) opening the discharging switch;

e) connecting the charge measurement means to a controller and reading from the charge measurement means a first quantity of charge transferred thereinto;

f) comparing a first predetermined charge value stored in the controller with the first quantity of charge read from the charge measurement means; and g) controlling, by means of an electrical output from the controller, the valve to open and thereby supply water to the spout if the first quantity of charge exceeds the predetermined charge value, otherwise controlling the valve to be closed and to not supply water to the spout.

34. The method of claim 33 wherein the charging switch comprises a first transistor switched by a first pulse having a pulsewidth equal to the first duration, and the discharging switch comprises a second transistor switched by a second pulse having a pulsewidth equal to the second duration, the first and the second pulses supplied by a pulse generating means controlled by the controller; and wherein the charge measurement means comprises a detection capacitor and a reset transistor.

35. The method of claim 33 wherein one of the first and the second durations is less than a characteristic time constant associated with a water film shunting the conducting plate, the water film conducting pulses having durations greater than the characteristic time constant, the water film not conducting pulses having durations less than the characteristic time constant.

36. The method of claim 33 wherein one of the first duration and the second duration is less than a characteristic time constant associated with a body of water shunting the conducting plate, the water conducting pulses having durations greater than the characteristic time constant, the water not conducting pulses having durations less than the characteristic time constant, the method further comprising additional steps taken after step g) when the valve is controlled to be open of:

h) closing the charging switch and thereby connecting the plate to the source of dc voltage for a longer charging interval having a third predetermined duration greater than both the characteristic time constant and the first predetermined duration;

i) opening the charging switch at the conclusion of the longer charging interval;

j) closing the discharging switch and thereby connecting the plate to the charge measurement means for a longer discharging interval having a fourth predetermined duration greater than both the characteristic time constant and the second predetermined duration;

k) opening the discharging switch;

l) connecting the charge measurement means to the controller and reading from the charge measurement means a second quantity of charge transferred thereinto;

m) comparing a second predetermined charge value stored in the controller with the second quantity of charge read from the charge measurement means; and n) holding the valve open if the second quantity of charge exceeds the second predetermined charge value, otherwise controlling the valve to be closed.

37. The method of claim 36 comprising an additional step d1) intermediate steps d) and e) of repeating steps a) through d) a first predetermined number of times before doing step e).

38. The method of claim 36 comprising an additional step k1) intermediate step k) and step l) of repeating steps h) through k) a second predetermined number of times before doing step l).

39. The method of claim 37 comprising an additional step k1) intermediate step k) and step l) of repeating steps h) through k) a second predetermined number of times before doing step l).

40. The method of claim 33 comprising an additional step d1) intermediate steps d) and e) of repeating steps a) through d) a predetermined number of times before doing step e).

41. The method of claim 33 wherein one of the first duration and the second duration is less than a characteristic time constant associated with a body of water shunting the conducting plate, the water conducting pulses having durations greater than the characteristic time constant, the water not conducting pulses having durations less than the characteristic time constant, the method further comprising additional steps taken after step g) when the valve is controlled to be open of:

h) waiting a predetermined interval;

i) repeating steps a) through e) and thereby reading from the charge measurement means a second quantity of charge;

j) comparing the second quantity of charge with the first quantity of charge and;

k) controlling, the valve to close if the absolute value of the algebraic difference between the first and the second quantities of charge is less than a second predetermined value.

42. A method of operating a capacitive sensor for sensing the presence of an object proximate a sensing plate by measuring a change in a capacitance to an electrical ground, the method comprising the steps of:

a) setting an output of a charge detector to a first predetermined voltage, the charge detector comprising filter means;

b) charging the plate from a voltage source to a second predetermined voltage;

c) discharging, for a predetermined discharging interval, the plate into the charge detector;

d) repeating steps b) through c); and e) reading an output of the charge detector as a representation of the capacitance of the plate.

43. The method of claim 42 further comprising a first additional step before step b) of connecting the plate to the voltage source, and a second additional step intermediate step b) and step c) of disconnecting the plate from the voltage source.

44. The method of claim 43 further comprising a third additional step intermediate the first and the second additional steps of waiting a predetermined switch crossover interval, the switch crossover interval shorter than the subsequent discharging interval.

45. The method of claim 42 further comprising steps following step e) of:

f) digitizing the output of the filter means;

g) storing the digitized output of the filter means as a first value in a memory;

h) repeating steps b) through e), and i) combining the digitized output obtained in step h) and the first value.

46. The method of claim 45 further comprising a step subsequent to step c), but prior to step h) of waiting for an interval of pseudo-random duration.

47. The method of claim 42 further comprising a step intermediate steps b) and e) of reducing, by means of a charge subtractor circuit, the output of the charge detector by a predetermined incremental value.

48. The method of claim 42, wherein the plate is connected to a shunting conductor substantially conducting electrical current pulses having durations greater than a first predetermined duration, the shunting conductor substantially not conducting current pulses having durations less than a second predetermined duration, and wherein the predetermined discharging interval is shorter than the second predetermined duration.

49. The method of claim 42 wherein step d) comprises repeating steps b) through c) a predetermined number of times greater than one.

50. Apparatus for measuring a capacitance to ground of a plate, the apparatus comprising:

a control means;

a charging means connecting the plate to a voltage source supplying a first predetermined voltage;

discharging means responsive to a discharging output from the control means to connect the plate to a charge measurement capacitor having a predetermined capacitance value, the charge measurement capacitor having two terminals, a first of the terminals maintained at a second predetermined voltage, the second of the terminals supplying a voltage output representative of the capacitance to ground of the plate;

reset means for resetting the charge measurement capacitor to a second predetermined voltage.

51. The apparatus of claim 50 wherein the charging means acts responsive to a charging output from the control means.

52. Apparatus of claim 50 wherein the control means comprises a computer having computer memory operatively associated therewith, the computer operating under control of a program stored in the memory.

53. The apparatus of claim 50 wherein the charging means comprises a current source.

54. The apparatus of claim 50 wherein the charging means comprises a transistor.

55. The apparatus of claim 50 wherein the discharging means comprises a transistor.

56. The apparatus of claim 50 wherein the control means comprises a computer and the conversion means comprises an analog to digital converter integral to the computer.

57. The apparatus of claim 50 wherein:

the control means comprises a computer having computer memory operatively associated therewith, the computer operating under control of a program stored in the memory;

the charging means acts responsive to a charging output from the computer, the charging output comprising a first voltage pulse applied to a first transistor, the first transistor a portion of the charging means;

the discharging output from the control means comprises a second electrical voltage pulse applied to a second transistor, the second transistor a portion of the discharging means; and the reset output from the control means comprises a third electrical voltage pulse applied to a third transistor, the third transistor a portion of the reset means.

58. A method of operating a capacitive sensor electrically connected between an electrical ground and a sensing plate disposed adjacent an external surface of a first object, the sensor measuring a capacitive change responsive to a second object adjacent the first object, the second object separately electrically coupled to the ground, the method comprising the steps of:

a) charging the plate from a voltage source;

b) connecting, for a discharging interval having a predetermined discharging duration, the plate to a charge detector having an output representative of the change of the capacitance to ground of the plate; and c) reading the output of the charge detector.

59. The method of claim 58 wherein step a comprises connecting the plate to the source of voltage for a charging interval having a predetermined charging duration, the method, further comprising a step intermediate steps a) and b) of waiting a predetermined switch crossover interval, the switch crossover interval shorter than the discharging duration.

60. The method of claim 58 further comprising steps following step c) of:

d) storing the output of the charge detector as a value in a memory;

e) repeating steps a) through c); and f) combining the current output of the charge detector and the value earlier stored in the memory.

61. The method of claim 60 comprising an additional step intermediate steps d) and f) of waiting for an interval of pseudo-random duration.

62. The method of claim 58 further comprising a step following step b) of repeating steps a) through b) a predetermined number of times.

63. The method of claim 58, wherein the plate is connected to a shunting conductor substantially conducting electrical current pulses having durations greater than a first predetermined duration, the shunting conductor substantially not conducting current pulses having durations less than a second predetermined duration, and wherein the predetermined discharging interval is shorter than the second predetermined duration.

* * * * *